United States Patent [19]

Gill

[11] Patent Number: 5,550,772
[45] Date of Patent: Aug. 27, 1996

[54] MEMORY ARRAY UTILIZING MULTI-STATE MEMORY CELLS

[75] Inventor: Manzur Gill, Saratoga, Calif.

[73] Assignee: National Semiconductor Corporation, Santa Clara, Calif.

[21] Appl. No.: 387,171

[22] Filed: Feb. 13, 1995

[51] Int. Cl.$^6$ ................................................. G11C 11/34
[52] U.S. Cl. ............................ 365/185.03; 365/185.24; 365/185.18
[58] Field of Search ..................... 365/185.01, 185.03, 365/185.24, 45, 185.18, 168

[56] References Cited

U.S. PATENT DOCUMENTS 4,181,980  1/1980  McCoy ........................................ 365/45
4,279,024  7/1981  Schrenk ..................................... 365/203

(List continued on next page.)

OTHER PUBLICATIONS

T. Blyth et al., "A Non–Volatile Analog Storage Device Using EEPROM Technology" ISSCC91/Session 11/Emerging Circuit Technologies/Paper TP11.7, Feb. 14, 1991 (192–193+).

M. Horiguchi et al., "An Experimental Large–Capacity Semiconductor File Memory Using 16–Levels/Cell Storage", IEEE Journal of Solid–State Circuits, vol. 23, No. 1, Feb. 1988, pp. 27–33.

C. Bleiker et al. "Four–State EEPROM using Floating–Gate Memory Cells", IEEE Journal of Solid–State Circuits, vol. SC–22, No. 3, Jun. 1987, pp. 460–463.

N. Saks et al., "Observation of Hot–Hole Injection of NMOS Transistors Using Modified Floating–Gate Technique", U.S. Government Publication, pp. 691–699.

K. Oyama et al., "Novel Erasing Technology for 3.3V Flash Memory with 64Mb Capacity and Beyond", 1992 IEEE, IEDM 92, pp. 607–610.

S. Yamada et al., "A Self–Convergence Erasing Scheme for a Simple Stacked Gate Flash EEPROM", 1991 IEEE, IEDM 91, pp. 307–310.

E. Takeda et al., "Device Performance Degradation Due to Hot–Carrier Injection at Energies Below the Si–SiO$_2$ Energy Barrier", 1983 IEEE, IEDM 83, pp. 396–399.

K. R. Hofmann et al., "Hot'Electron and Hole–Emission Effects in Short n–Channel MOSFET's", IEEE Transactions on Electron Devices, vol. ED–32, No. 3 Mar. 1985, pp. 691–699.

(List continued on next page.)

Primary Examiner—David C. Nelms
Assistant Examiner—Huan Hoang
Attorney, Agent, or Firm—Limbach & Limbach L.L.P.

[57] ABSTRACT

A non-volatile memory system is disclosed which includes an array of multi-state N channel floating gate memory cells along with associated control circuitry for programming, reading and erasing the cells of the array. Small geometry single transistor memory cells are used which are capable of operating both in the enhancement and the depletion modes of operation. The associated control circuitry includes circuitry for programming selected cells of the array to one of a multiplicity of programmed states, typically four states. At least one of the programmed states results in the cell having a negative threshold voltage, relative to the source region of the cell, thereby indicating depletion mode operation, with the remaining states resulting in the cell having positive threshold voltage. The use of both polarity threshold voltages increases the voltage margin between states thereby enhancing the reliability of read/write operations. The memory read circuitry applies a positive voltage, relative to the source region of the target cell, to the word line associated with the selected cell for carrying out read operations. In addition, the read circuitry applies a negative voltage to the remaining word lines so that deselected cells which are in the same column as the selected cell do not conduct current which would interfere with the reading of the selected cell. This latter feature avoids the necessity of using large geometry split channel memory cells in order to eliminate current flow in deselected cells.

17 Claims, 6 Drawing Sheets

U.S. PATENT DOCUMENTS

| | | | |
|---|---|---|---|
| 4,357,685 | 11/1982 | Daniele et al. | 365/189 |
| 4,698,787 | 10/1987 | Mukerjee et al. | 365/185 |
| 5,021,999 | 6/1991 | Kohda et al. | 365/168 |
| 5,043,940 | 8/1991 | Harari | 365/168 |
| 5,187,683 | 2/1993 | Gill | 365/185 |
| 5,204,835 | 4/1993 | Eitan | 365/185 |
| 5,346,842 | 9/1994 | Bergemont | 437/52 |
| 5,394,362 | 2/1995 | Banks | 365/189 |
| 5,418,743 | 5/1995 | Tomioka et al. | 365/189 |

OTHER PUBLICATIONS

Y. Nissan–Cohen, "A Novel Floating–Gate Method for Measurement of Ultra–Low Hole and Electron Gate Currents in MOS Transistors", IEEE Electron Device Letters, vol. EDL–7, No. 10, Oct. 1986, pp. 561–563.

R. Bez et al., "A Novel Method for the Experimental Determination of the Coupling Ratios in Submicron EPROM and Flash EEPROM Cells", 1990 IEEE, IEDM 90, pp. 99–102.

MEMORY ARRAY UTILIZING MULTI-STATE MEMORY CELLS

BACKGROUND OF THE INVENTION

1. Field of the Invention

The present invention relates generally to non-volatile semiconductor memories and, in particular, to semiconductor memories which include multistate EPROM or EEPROM cells.

2. Background Art

Non-volatile semiconductor memories including EPROMs (Electrical Programmable Read Only Memories) and EEPROMs (Electrically Erasable Programmable Read Only Memories) and Flash memories are becoming more popular. These memories utilize memory cells having a floating gate which is electrically isolated from the remainder of the cell and which stores an electrical charge indicative of the state of the cell.

Referring to the drawings, FIG. 1A shows one exemplary embodiment of a conventional flash memory cell 10. The cell 10 is formed in a P− type substrate 12, with an N+ type diffusion being formed in the substrate 12 to form the cell drain region 14. Cell 10 could also be formed in a P− type well, with term semiconductor body referring both to a substrate and a well. A graded N+/N− diffusion 16 is further formed in the substrate to from the source region. That portion of the substrate 12 intermediate the source and drain region is referred to as the channel region 12a and is the location where the N type channel is formed when the cell is rendered conductive. As defined herein, the drain region 14 for the subject N channel cells 10, as distinguished from the source region 16, is that region which is at the most positive voltage during read operations.

A floating gate 18, preferably fabricated from doped polysilicon, is disposed over the channel region 12a. A control gate 20, also preferably made of doped polysilicon, is disposed over the floating gate 18. The floating gate 18 is separated from the channel region 12a by a thin gate oxide layer which is typically 100 Å thick. The floating gate 18 and the control gate 20 are separated from each other by a relatively thick interpoly dielectric 24.

The threshold voltage ($V_{TH}$) of the cell 10 is defined herein as being that voltage applied to the control gate 20, relative to the source region 16, which causes a current to flow from the drain to the source ($I_{DS}$) of 1 microampere when the drain to source voltage is +1 volt. In the case of flash memory cells and other types of floating gate devices, the threshold voltage $V_{TH}$ of the cell can be adjusted by changing the charge on the floating gate 18 during the programming of the cell. The magnitude of the threshold voltage $V_{TH}$ determines the state of the cell, that is, whether the cell is programmed to a "1" or a "0' state.

FIG. 1A shows the configuration of the cell 10 during a programming sequence. Initially, the cell 10 is in a completely erased state with no charge being present on the floating gate. A relatively large positive voltage $V_{pp}$, typically +10 to +12 volts, is applied to the control gate and the source region 14 is grounded ($V_{SS}$). In addition, the drain region is connected to an intermediate voltage VDD of typically +6 to +9 volts. These conditions cause electrons to exit the source region and travel towards the drain region 14. The electrons will be injected from the channel region 12a and onto the floating gate 20 by virtue of the positive voltage on the control gate 20 by a mechanism commonly referred to as CHE (channel hot electron). As is well known, the presence of the negative electric charge on the floating gate alters the threshold voltage of the cell, with a programmed cell 10 typically being assigned the arbitrary logic state of "0". An unprogrammed cell 10, one that is in the erased state, is thus assigned the logic state of "1".

FIG. 1B depicts the conditions for reading the flash memory cell 10. The source region is grounded ($V_{SS}$) and a positive voltage $V_{CC}$ is applied to the control gate 20. Voltage $V_{CC}$, which is the primary memory supply voltage, is typically +5 volts. In addition, positive voltage $V_R$ is applied to the drain region. Voltage $V_R$, which is derived from an active load divider (not depicted) connected to voltage $V_{CC}$, is typically +1 volts.

Assuming that the cell 10 being read is in the original erased state, that is, the cell has not been programmed, the threshold voltage $V_{TH}$ will be relatively low. The magnitude of the voltage $V_{CC}$ applied to the control gate 20 will be sufficient to invert the channel region 12a so that an N type channel will be formed between the drain and source regions. The flow of drain/source current $I_{DS}$ will result in an increase in voltage dropped across the active load which will be detected by a sense amplifier (not depicted) connected between the drain region 14 and voltage $V_{CC}$. The sensed change in voltage indicates that the cell being read is in a given logic state ("1").

In the event the cell 10 being read had been previously programmed, the presence of negative charge on the floating gate 18 will effectively increase the threshold voltage $V_{TH}$ of the device. In that event, the applied source-control gate voltage $V_{CC}$ will not be sufficient to invert the channel region 12a. The cell 10 will remain non-conductive and the voltage at the drain ($V_R$) will remain unchanged. The sense amplifier, connected to the drain of the cell, will interpret cell 10 to be in a state ("0") opposite to that when the cell remains in an erased, low threshold voltage state ("0").

The cell 10 is erased under the conditions shown in FIG. 1C. The drain region 14 is left floating (F) and the source region 16 is connected to positive voltage $V_{CC}$. In addition, a negative voltage $V_{EE}$ is applied to the control gate 20. The resultant electric field causes electrons to be removed from the floating gate 20 to the source region 16 by way of Fowler-Nordheim tunneling.

It is possible during an erase sequence to create what is sometimes referred to as an "over erase" condition wherein the number of electrons removed from the floating gate 18 is such that a net positive charge is formed on the floating gate. This net positive charge on the floating gate can be of sufficient magnitude such that the channel region 12a remains inverted (N type) even when the control gate 20 is at ground potential. Thus, the cell 10 is operating in a depletion mode as opposed to the normally-desired enhancement mode. This condition (depletion mode operation) is generally avoided because an overerased cell will be in a conductive state even when the cell has been deselected in a memory read operation. The resultant $I_{DS}$ current in the deselected cell will tend to mask the current (or lack of current) flow through the selected cell.

It is well known that the data storage density of memory cells, including flash memory cells, can be increased by increasing the number of memory states for each cell from two (one bit) to a larger number such as four (two bits), eight (three bits), and so forth. By way of example, U.S. Pat. No. 5,043,940 entitled "Flash EEPROM Memory Systems Having Multistate Storage Cells" discloses a technique wherein each cell is capable of storing a multiple number of bits using a split channel flash memory cell.

FIG. 2 shows a typical exemplary prior art split channel flash memory cell 26 of the type disclosed in the above-noted U.S. Pat. No. 5,043,940. The split channel cell, sometimes referred to as a split gate cell or a one and one-half transistor cell, is formed in a P– type substrate 12 and includes an N+ type drain region 14 and an N+ type source region 16 separated by a channel region split between regions segments 12a and 12b. A polysilicon floating gate 18 is disposed over channel region segment 12a, but not segment 12b. The floating gate 18 is separated from the channel segment 12a by a thin (typically 100 Å) gate oxide 22.

Split channel cell 26 further includes a polysilicon control gate 20 having one segment 20a overlying the floating gate 18 and separated from the floating gate 18 by an interpoly dielectric 24. The control gate 20 includes another segment 20b separated from channel segment 12b by the gate oxide 22.

Operation of the split channel cell 26 is similar to that of the single transistor cell 10 of FIG. 1 in many respects. The cell 26 can be viewed as having two threshold voltage—one associated with channel segment 12a and one associates with channel segment 12b. The threshold voltage associated with segment 12b remains fixed and may be, by way of example, +1.5 volts. The threshold voltage associated with channel segment 12a will vary with the charge present on the floating gate 18 and may vary from +5 volts to +1 volt.

It is possible to overerase cell 26 in the same manner as the single transistor cell 10. In that event, channel segment 12a will become inverted (N type) and the threshold voltage associated with segment ($V_{Ta}$) will become negative. However, channel segment 12b will not become inverted since the floating gate 18 does not overlie that portion of the channel. Thus, even if the control gate 20 is grounded, thereby permitting channel segment 12a to remain inverted, the threshold voltage associated with channel segment 12b ($V_{Tb}$) will not be exceeded. Since channel segments 12a and 12b are connected in series, the cell 26 will remain non-conductive when the control gate 20 is grounded (when the cell is deselected), notwithstanding the fact that the cell was overerased.

The FIG. 2 cell 26 can, as disclosed in the above-noted U.S. Pat. No. 5,043,940, be implemented in a memory array having more than two states per cell. This is accomplished by programming/erasing the cell 26 so that there are four distinct threshold voltages $V_{Ta}$ associated with the channel segment 12a thereby providing four distinct states. It is desirable to maximize the voltage separation between the four states so as to provide greater operation reliability due to increased sense margin. This can be accomplished by erasing/programming the cells to have both negative and positive threshold voltages $V_{Ta}$.

A negative threshold voltage $V_{Ta}$ means that the net charge on the floating gate 18 is positive, a condition similar to the above-described overerase condition previously described in connection with FIG. 1. Thus, the threshold voltage $V_{Ta}$ of the cell 26 may be, by way of example, +4.5 volts (State "0"), +2.0 volts (State "1"), –0.5 volts (State "2") and –3.0 volts (State "3"). When cell 26 is read, the typical conditions are depicted in FIG. 2. The source region 16 is grounded ($V_{SS}$) and the drain region is connected to voltage $V_R$ which is derived from a higher voltage through an active voltage divider network. A voltage $V_{CC}$ of typically +5 volts is applied to the control gate 20. The voltage $V_{CC}$ is sufficient to invert channel segment 12b which has a fixed threshold voltage of typically +1 volt. The voltage $V_{CC}$ is also sufficient to invert channel segment 12a so that the cell 26 is rendered conductive. The magnitude of the resultant drain/source current $I_{DS}$ is a function of the variable threshold voltage $V_{Ta}$. Using a sense amplifier arrangement to differentiate between the four possible values of $I_{DS}$, it is possible to determine the programmed state of the cell 26.

As is well known, the cells 26 are typically arranged in an array having a plurality of rows and columns. All of the cells in a particular column typically have their sources and drains connected to respective bit lines and all of the cells in a particular row are connected to a common word line. As is well known, a particular cell in the array is selected for reading by applying the appropriate voltages shown in FIG. 2 to the appropriate bit and word lines. Other cells in the same row are deselected during the read sequence by grounding the bit line connected to the drains 14 of the cells, as opposed to applying voltage VR to the selected cell. Other cells in the same column as the selected cell are deselected by grounding the word line connected to the control gate 20. A grounded control gate 20 for the FIG. 2 split channel cell 26 will insure that current does not flow notwithstanding the fact that the cell may be programmed to have a negative threshold voltage $V_{Ta}$. This is because the threshold voltage $V_{Tb}$ associated with channel segment 12b will be at a fixed positive voltage of typically +1 volts. Thus, the deselected ones of cells 26 will not be turned on, thereby permitting the selected cell 26 to be properly read.

The previously described multistate cell 26 thus provides increased data storage density since each cell is capable of storing more than one bit of data. However, the split channel (one and one-half transistor) configuration of the cell 26 as shown in FIG. 2 requires more area to implement than does simpler cell configurations such as single transistor cell 10 shown in FIG. 1. Furthermore, the overall threshold voltage $V_{TH}$ of the split channel cell 26 is a function of the both the fixed threshold voltage associated with channel segment 12b and the variable threshold voltage associated with channel segment 12a. The fixed threshold voltage component tends to diminish the influence of the variable component such that the voltage margin between states is smaller than it would otherwise be in the case of a single transistor cell 10 as shown in FIGS. 1A–1C. However, the single transistor cell 10 does not have a split channel to overcome the above-described problem which arises when the cell 10 has been programmed to a state where the threshold voltage $V_{TH}$ is negative, that is, when the cell has been programmed into the depletion mode.

The present invention is directed to a memory system having single transistor cells which are capable of multistate memory operation, that is, storing a multiplicity (three or more) of states so as to enhance memory density. It is further possible to program the cells over a wide range of threshold voltages $V_{TH}$, including negative voltages, so as to increase the reliability of memory read operations. The advantage of increased voltage margin between states is provided since the single transistor cell does not have the fixed threshold voltage component associated with split channel cells. Further, smaller geometry single transistor cells provide enhanced memory density in comparison to split channel cells. These and other advantages of the subject invention will be apparent to those skilled in the art upon a reading of the following Detailed Description of the Invention together with the drawings.

SUMMARY OF THE INVENTION

A non-volatile memory system is disclosed which includes an array of memory cells and associated control circuitry for programming, reading and erasing the cells of the array. The memory cell array include a P conductivity type semiconductor body and a group of memory cells disposed in the body. The semiconductor body could, by way of example, be either the substrate or a P type well formed in the substrate. The cells are arranged in the array in a multiplicity of rows and columns. Each of the cells are floating gate type cells having an N conductivity type drain region and an N conductivity type source region, spaced apart from the drain region so as to form a channel region in the semiconductor body intermediate the source and drain regions.

The cells further each include a floating gate disposed over the channel region and insulated from the channel region and a control gate disposed over the floating gate and insulated from the floating gate. The control gates of all of the cells located in an array row are connected to a common word line.

The associated control circuit includes circuitry for programming selected cells of the array to a multiplicity of programmed states. Typically, there are four programmed states so that each cell is capable of storing two bits of data. A first one of the programmed states results in the selected cell in having a positive threshold voltage, relative to the source region of the cell. A second one of the programmed states results in the selected cell having a negative threshold voltage. A negative threshold voltage for an N channel type cell is indicative that the cell is operating in the depletion mode of operation where a net positive charge is present on the floating gate. By operating the memory cell in both the positive and negative threshold voltage ranges, the margin between program states is increased so that reliability of operation is enhanced.

The associated control circuit includes read circuitry for applying voltages to selected cells so that the programmed state of the cell can be determined. This includes the application of a positive voltage, relative to the voltage applied to the source region of the cell, to the word line associated with the row in which the selected cell is located and for applying a negative voltage to the remaining word lines of the array. The positive voltage will cause the selected cell to conduct current indicative of the programmed state of the cell and the negative voltage will force the deselected cells in rows other than the row in which the selected cell is located to remain non-conductive so as not to interfere with the reading of the selected cell.

DETAILED DESCRIPTION OF THE INVENTION

Figure 1A:
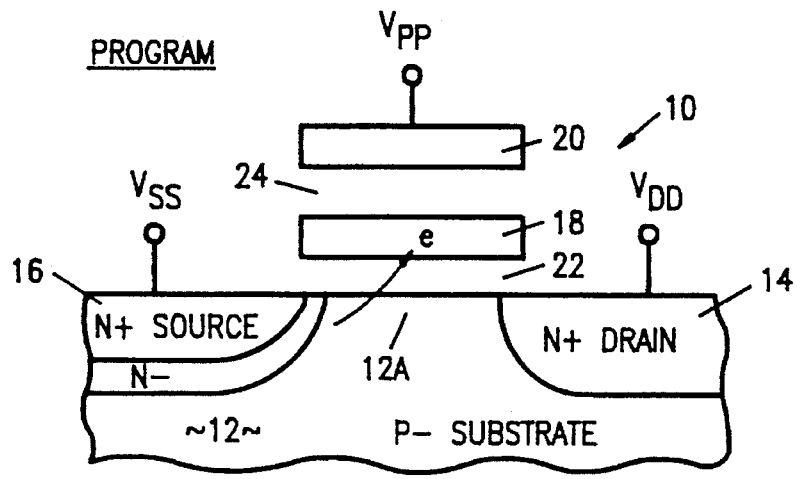
FIGS. 1A–1C depict a conventional single transistor flash memory cell configured for memory programming, reading and erasing operations, respectively.
Figure 1B:
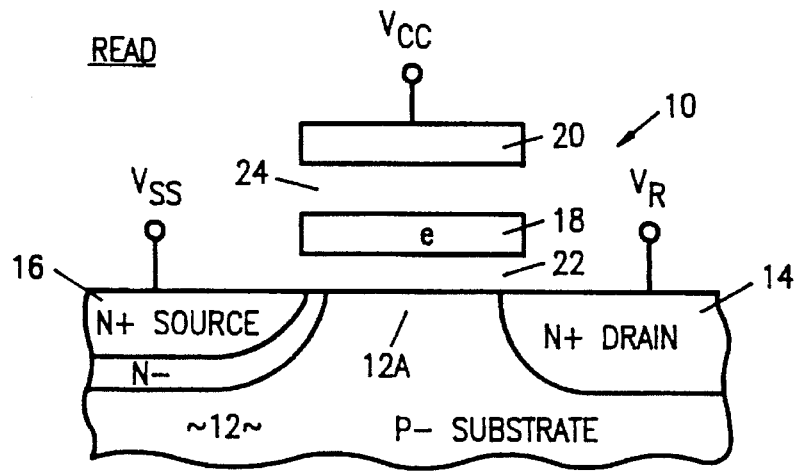
Figure 1C:
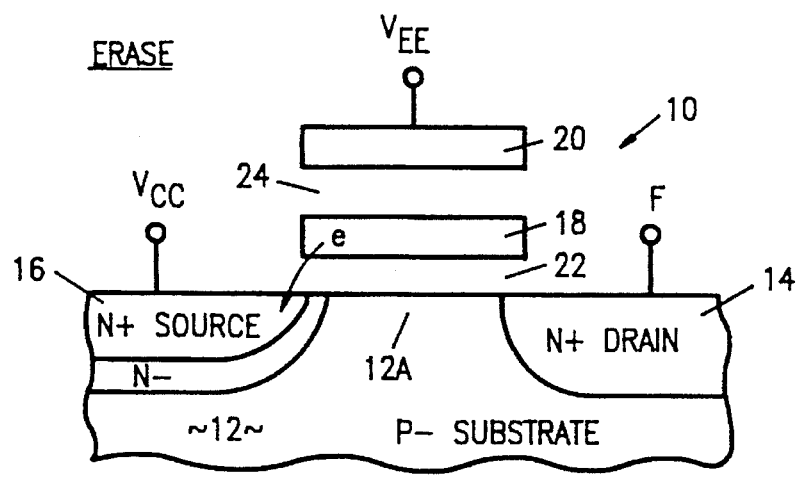
Figure 2:
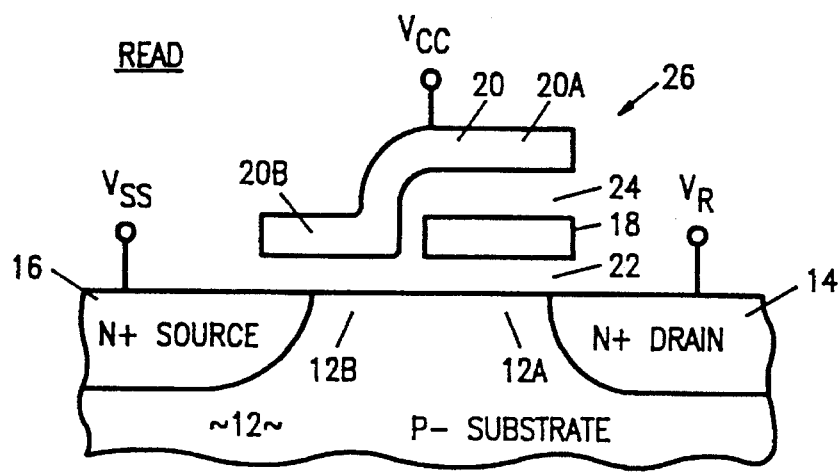
FIG. 2 depicts a conventional split channel flash memory cell, sometimes referred to as a one and one-half transistor cell, configured for memory reading operations.
Figure 3A:
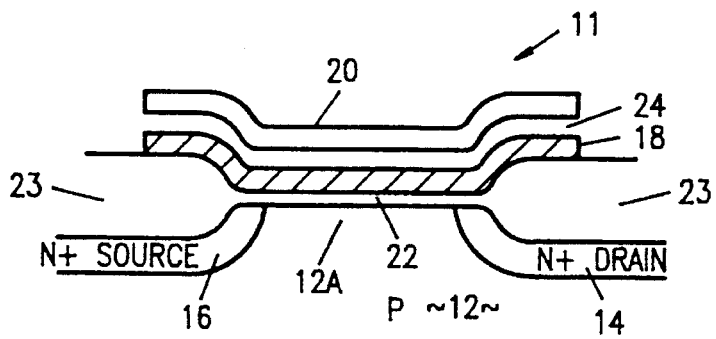
FIGS. 3A and 3b are a cross-sections of one memory cell and two adjacent conventional memory cells, respectively, of the type preferred for use in connection with the subject memory system.

Referring again to the drawings, FIG. 3A shows a cross-section of a conventional single transistor cell 11 somewhat similar to cell 10 of FIGS. 1A–1C. As will be explained, although either cell 10 or 11 can be used in connection with the subject invention, the subject invention will be described assuming that cell 11 is used, even though cell 10 could also be used.

Cell 11, unlike cell 10, is implemented such that the cell is programmed utilizing the Fowler-Nordheim tunneling mechanism rather than the channel hot electron (CHE) mechanism. As is well known, the coupling coefficient between the control gate and floating gate of cell 11, sometimes referred to as $KP_2P_1$ (coupling between Poly 2 and Poly 1), is typically about 0.6 to 0.75 so that Fowler-Nordheim tunneling can occur during programming. $KP_2P_1$ for cell 10 which used CHE for programming, is somewhat less, typically 0.6. As can be seen in FIG. 3A, cells 11 are symmetrical, utilizing graded junction drain and source regions 14 and 16, respectively. The source and drain regions are separated by a P– type channel region 12a of the semiconductor body 12 which may be either a substrate or a well formed in the substrate.

The polysilicon floating gate 18 is disposed over the channel region 12a and separated form the channel region by a thin (100 Å) gate oxide 22. As was the case of cell 10 of FIG. 1A–1C, floating gate 20 extends from the drain region 14 to the source region 16 so that the conductivity of the full length of channel region 12a is controlled by the floating gate 18. Buried thick oxide segments 23 are disposed adjacent the drain and source regions 14 and 16, with segments 23 typically being 1000 Å to 3000 Å thick.

Figure 3B:
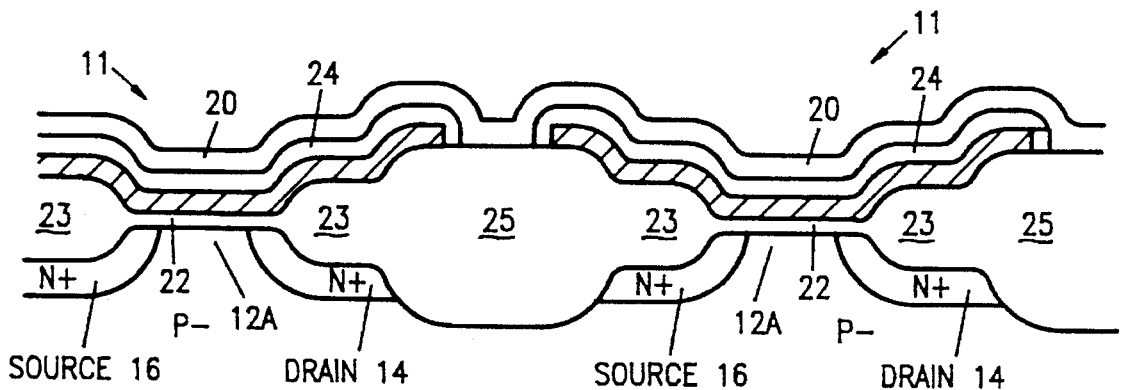

Cell 11 includes a polysilicon control gate 20 which is separated from the polysilicon floating gate 18 by an inter-poly dielectric 24, typically referred to as ONO. As can be seen in FIG. 3B which shows two adjacent cells 11, the control gates 20 are connected together to form a common word line. As can also be seen in FIG. 3B, each cell has its own separate drain and source regions 14 and 16. In addition, a field oxide 25, typically 6,000 Å to 10,000 Å thick is disposed intermediate the two adjacent cells 11 and functions to isolate the two cells from each other.

Table 1 below shows the voltages which are used to program, erase and read cell 11.

TABLE 1

| OPERATION | DRAIN | SOURCE | CONTROL GATE |
| --- | --- | --- | --- |
| PROGRAM | $V_{SS}$ | F | $V_{PP}$ |
| ERASE | F | $V_{CC}$ | $V_{EE}$ |
| READ | $V_R$ | $V_{SS}$ | $V_{CC}$ |

As can be seen from Table 1, cell 11 is programmed by grounding ($V_{SS}$) the drain region 14 and floating (F) the source region 16. A positive voltage $V_{pp}$ of typically +18 to +20 volts is applied to the control gate 20. These conditions cause electrons originating in the vicinity of the drain region 14 to be transferred to the floating gate 18 by way of the Fowler-Nordheim tunneling mechanism. As is well known, the resultant negative charge on the floating gate 18 alters the threshold voltage $V_{TH}$ of the cell 11.

Cell 11 is erased, as indicated by Table 1, by floating (F) the drain region 14 and connecting a positive voltage $V_{CC}$ to the source region 16. VCC is typically +3 to +5 volts. In addition, a large negative voltage $V_{EE}$ is applied to the control gate 20. This combination of voltages causes the electrons to be removed from the floating gate 18. It is possible to remove a sufficient number of electrons so that there is a net positive charge on the floating gate 20 similar to that which can occur in connection with cell 10.

Cell 11 is read by grounding ($V_{SS}$) the source region 16 and applying a positive voltage $V_R$ to the drain region 14. In addition, a positive voltage $V_{CC}$, typically +3 to +5 volts, is applied to the control gate 20. These conditions will cause cell 11 to become conductive, depending upon the programmed state of the cell, as will be further explained.

Figure 4:
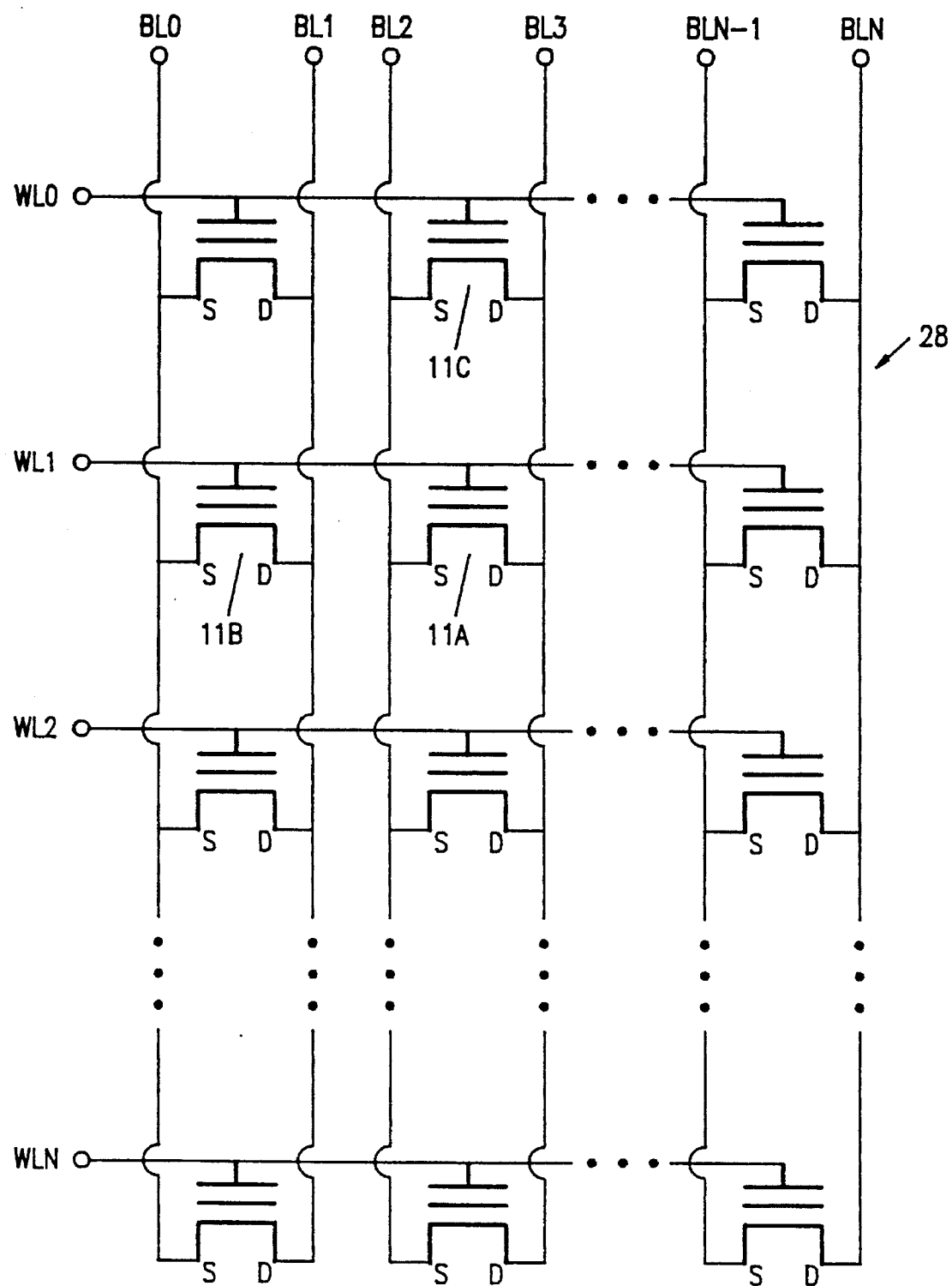
FIG. 4 shows a multistate memory array comprising single transistor flash memory cells arranged in rows and columns.

FIG. 4 shows a memory array 28 comprised of flash memory cells arranged in rows and columns. The individual cells are preferably similar to the small geometry cells 11 previously described in connection with FIGS. 3A and 3B. All of the cells 11 in a particular row have their respective control gates 20 connected to a common word line. By way of example, cells 11A, 11B and the other cells in the same row have their control gates connected to word line WL1. In addition, all of the cells in a particular column have their drain regions 14 and source regions 16 connected to respective common bit lines. For example, cells 11A, 11C and the other cells in the same column have their drain regions connected to common bit line BL3 and their source regions connected to common bit line BL2.

Figure 5:
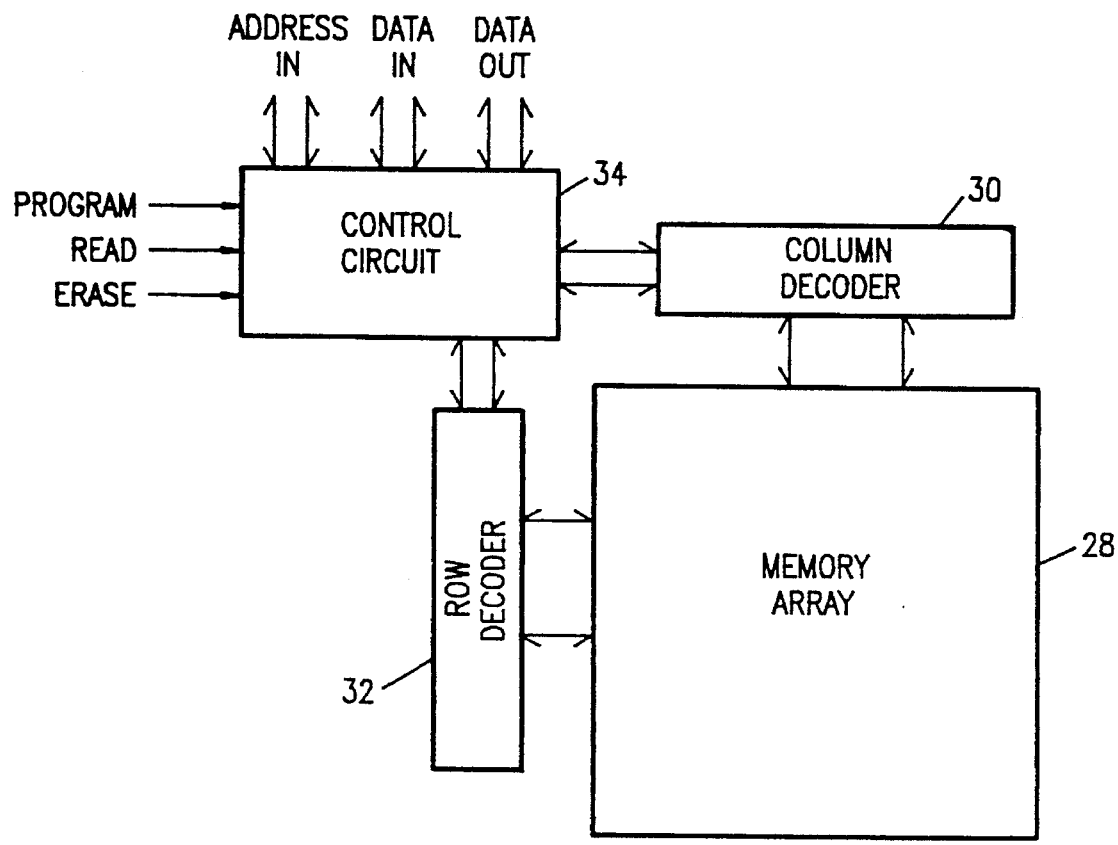
FIG. 5 is a simplified block diagram of a memory system which includes the FIG. 4 memory array and associated control circuitry.

FIG. 5 shows a memory system which includes an array 28 of flash memory cells 1 1. The system is provided with a Column Decoder 30 which is connected to the bit line BLN of array 28 and a Row Decoder connected to the word lines WLN of the array. The system further includes a Control Circuit 34 which performs most of the functions relating to memory operations as will be described.

The cells 11 are programmed to provide multistate capability. In the present example, each cell 11 can have one of four potential states thereby enabling each cell to store two bits of data. Table 2, below, shows the four States "0", "1", "2" and "3" and the corresponding threshold voltage VTH of the cell. In order to increase the voltage separation between states so as to reduce the likelihood that a read error will occur, one of the states, State "3" is in depletion mode, as indicated by the negative threshold voltage.

TABLE 2

| STATE | THRESHOLD VOLTAGE (volts) |
|---|---|
| 0 | +4.0 to +3.0 |
| 1 | +2.5 to +1.5 |
| 2 | +1.0 to 0 |
| 3 | −0.5 to −1.5 |

Table 3 below shows the various conditions necessary to carry out memory operations, including programming, erasing and reading. The voltages set forth in the table are applied by the FIG. 5 Column Decoder 30 and the Row Decoder 32 under the direction of the Control Circuit 34.

TABLE 3

| | PROGRAM | ERASE | READ (ALT 1) | READ (ALT 2) |
|---|---|---|---|---|
| SELECTED WORD LINE | $V_{PP}$ | $V_{EE}$ | $V_{SE}$ | $V_{SE}$ |
| DESELECTED WORD LINE | $V_{PP}/2$ | $V_{EE}$ | $V_N$ | $V_N$ |
| SELECTED BIT LINE - SOURCE | F | F | $V_{SS}$ | $V_{SS}$ |
| SELECTED BIT LINE - DRAIN | $V_{SS}$ | $V_{CC}$ | $V_R$ (S/A) | $V_R$ (S/A) |
| DESELECTED BIT LINE - SOURCE | F | F | $V_R$ | $V_{SS}$ |
| DESELECTED BIT LINE - DRAIN | $V_{PP}/2$ | $V_{CC}$ | $V_R$ | $V_{SS}$ |

Prior to the programming of selected cells, it is necessary to erase the entire array so that the threshold voltage $V_{TH}$ corresponds to State "3" as set forth in Table 2. Erase algorithms for carrying out the erase function are well known in the art and need not be described in detail here. The erase operation includes two basic steps. First, all of the cells 11 are programmed to the maximum threshold state, State "0", where the threshold voltage ranges from +4.0 to +3 volts, as indicated by Table 2.

Next, once all of the cells 11 have been programmed to State "0", the entire array 28 is erased, or a block of cells are erased, depending upon the particular implementation of the memory. This is accomplished by applying the erase voltages set forth in Table 3. The voltages are applied in unit pulses and the threshold voltages $V_{TH}$ of the cells 11 are tested to determine whether the target erased threshold voltage has been reached. In this case, the target erased threshold voltage corresponds to State "3" shown in Table 2. Ideally, the erased threshold voltage should be close to −1.5 volts or slightly higher (e.g., −1.4 volts).

Once the entire array 28 has been erased down to the desired target erased threshold voltage, selected cells can then be programmed to the desired state. The programming voltages are set forth in Table 3 and method of programming will be subsequently described. Assume, for example, that cell 11A (FIG. 4) is to be programmed to one of States 0–3. As indicated by Table 3, voltage $V_{pp}$ is applied to the selected word line WL1. Voltage $V_{pp}$ is typically +18 to +20 volts. In addition, the selected bit line connected to the source region of the target cell 11A, line BL2, is left floating (F) and the selected bit line connected to the drain region of the target cell, line BL3, is grounded ($V_{SS}$). As will be explained, the magnitude and/or duration of the programming pulse $V_{pp}$ is controlled so as to program the target cell to the desired state.

The deselected word lines during a programming sequence, lines WL0, WL2 and WLN, are connected to voltage about equal to $V_{pp}/2$ which has a magnitude ranging from about −8 volts to about −11 volts. In addition, the deselected bit lines associated with the sources of the deselected cell, lines BL0 and BLN-1 are left floating (F) and the deselected bit lines associated with the drains of the deselected cell, lines BL1 and BLN, are connected to a voltage about equal to $V_{pp}/2$.

The above-described conditions will cause target cell 11A to be programmed by way of Fowler-Nordheim tunneling so as to add a negative charge to the floating gate of the cell.

The conditions will further prevent the deselected cells from becoming programmed. Details regarding one exemplary programming sequence will be subsequently described in connection with FIG. 6.

Table 3 also shows the voltages to be applied to the array 28 during a cell 11 reading sequence. Two alternative reading conditions are set forth in the table. The first alternative set of conditions calls for a voltage $V_{SE}$ to be applied to the selected word line. Assuming that cell 11A (FIG. 3) is to be read, voltage $V_{SE}$ is applied to word line WL1 having a magnitude of approximately +3 volts. The bit line associated with the source of cell 11A, line BL2 is connected to ground ($V_{SS}$) and the bit line associated with the drain, line BL3 is connected to a positive voltage $V_R$ which is typically generated by an voltage divider connected to the bit line which further functions as a load. Voltage $V_R$ is typically about +1 volt. These conditions will cause the target cell 11A to become conductive for States 1–3, with the magnitude of the drain/source current $I_{DS}$ being a function of the programmed state of the cell.

As also indicated by Table 3, the deselected word lines WL0, WL2 and WLN, are connected to a negative voltage $V_N$ of typically –3 volts. In addition, voltage $V_R$ is connected to the deselected bit lines including lines BL0, BL1, BLN-1 and BLN. The negative voltage $V_N$ functions to ensure that the deselected cells located in those rows other than the row in which the target cell is located will remain non-conductive even when the deselected cells have been programmed to the depletion mode. By way of example, cell 11C will remain non-conductive because the control gate to source voltage will range from –3 to –6 volts, more than enough voltage to cause a cell having a worst case threshold voltage of –1.5 volts (State "3") to remain non-conductive. Those deselected cells located in the same row as the selected cell, such as cell 11B, will remain disconnected from the sense amplifiers, while the selected cells in the selected columns are being read.

Table 3 also shows a second alternative set of conditions for carrying out the read sequence. These conditions are similar to those of the first alternative set except the deselected bit lines associated with the source and drain are both grounded ($V_{SS}$), as opposed to being connected to voltage $V_R$.

Figure 6:
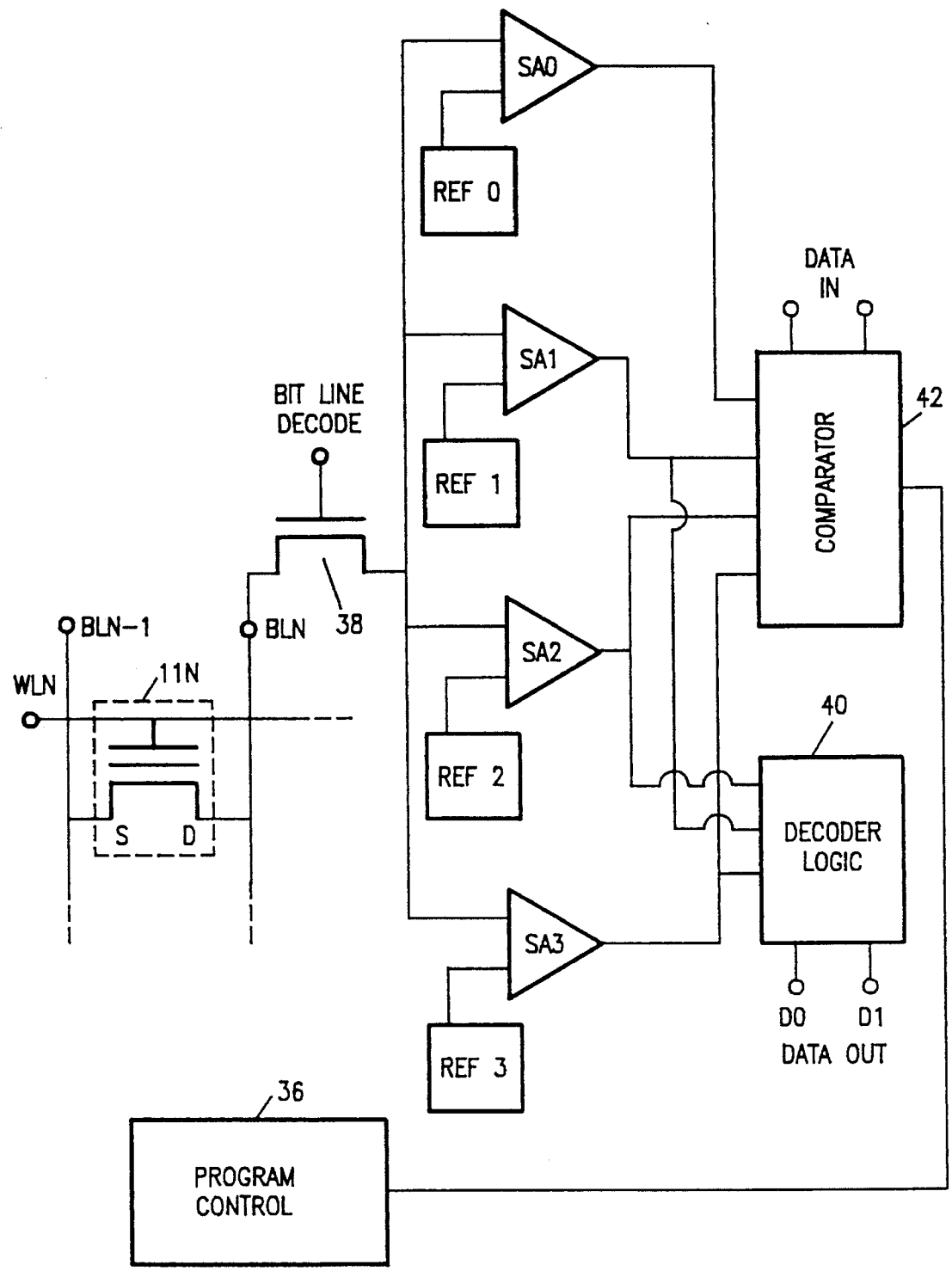
FIG. 6 is a simplified block diagram of circuitry for carrying out memory programming and reading operations of the FIG. 5 multistate memory system.

FIG. 6 is a diagram of part of the Column Decoder 30 and Control Circuit 34 (FIG. 5) for carrying out part of the programming and reading functions. During a read sequence, the target cell 11N is connected to the voltages shown in Table 3 (either alternative). A decoder transistor 38 connected to the bit line BLN associated with the drain of the cell 11N being read is turned on by the Control Circuit 34. Although not depicted, an active load is connected by the transistor 38 thereby causing voltage $V_R$ to be applied to the bit line BLN.

Decoder transistor 38 functions to connect the selected bit line BLN to a bank of four sense amplifiers SA0–SA3. Each of the sense amplifiers has an associated reference Ref0–Ref3 which corresponds to the drain/source current $I_{DS}$ for the four possible programmed states of cell 11N. When cell 11N has been programmed to State 0, the cell will conduct a predetermined current corresponding to that state. In the present example, this represents the minimum $I_{DS}$ current for the cells. Ref0 is implemented to provide a reference to one input to sense amplifier SA0 which is slightly less than the predetermined current for State 0. Thus, sense amplifier SA0 provides an active output only if cell 11N conducts a current $I_{DS}$ equal to or exceeds the current produced when the cell is in State "0".

The remaining sense amplifiers SA1–SA3 and associated respective references Ref1–Ref3 are used for providing an active output only if the measured cell $I_{DS}$ current equals or exceeds that which would be produced if the cell had been programmed to States 1–3. In reading cell 11N, which stores a total of two bits in the present example, only three current measurements need actually be made and only the outputs of sense amplifiers SA1–SA3 are connected to a Decoder Logic block 40. As will be explained, sense amplifier SA0 is used in the programming sequence.

Assuming that the cell 11N has been programmed to State 0, the cell current will be less than Ref1–Ref3 so that all of the three outputs connected to the Decoder Logic 40 will be inactive. In response to this condition, Decoder Logic 40 will produce data outputs D0 and D1 of "0,0". If the cell 11N has been programmed to State 1, the cell current will exceed Ref1 but will be less than Ref2 and Ref3. Thus, only the output of sense amplifier SA1 will be active. In that event, Decoder Logic 40 will produce data outputs D0 and D1 of "0,1". Continuing, if the cell 10N has been programmed to State 2, only the outputs of sense amplifiers SA1 and SA2 will be active thereby causing the Decoder Logic 40 to produce outputs "0,1". Finally, if the cell had been programmed to State 3, all three sense amplifier outputs will be active and the Decoder Logic 40 output will be "1, 1".

As previously noted, the FIG. 6 circuitry is also used in programming the cells to the desired state. All of the cells are originally in an erased state having a threshold voltage $V_{TH}$ which is somewhat higher than the minimum voltage –1.5 volts, such as –1.4 volts. Initially, it is preferable to read the target cell to determine the actual threshold voltage of the cell. This is done in the manner previously described by applying the appropriate voltages to selected and deselected word lines and bit lines as set forth in Table 3. The voltages set forth in Table 3 are applied to the selected or target cell 11N and to the selected cells based upon the address of the target cell supplied to the Control Circuit 34. In addition, the desired programmed state, represented by two bits of data, is provided to a Comparator 42 (FIG. 6). All four sense amplifier SA0–SA3 outputs are provided to the input of Comparator 42. Based upon the Data In applied to the Comparator 42, only the Sense Amplifier associated with the State which corresponds to Data In will be monitored and used for controlling Program Control 36.

Assume, for example, that the Data Input is "1,0" which corresponds to State 2. Comparator 42 will monitor only the output of Sense Amplifier SA2 during the programming sequence. At this stage of the programming sequence, when cell 11N is in a totally erased state, the cell current is first read by applying the voltages set forth in Table 3 for reading. At this stage, it is likely that none of the sense amplifier outputs will be active. The selected cell is then slightly programmed by application of a voltage pulse of magnitude $V_{pp}$ (Table 3) for a short duration so as to slightly increase the negative charge present on the floating gate thereby increasing the threshold voltage. The magnitude or duration of the programming pulse, or combination of both, applied to the word line WLN of the target cell should be controlled so that the resulting increase in threshold voltage is sufficiently small so that the target threshold voltage is not overshot.

Once the initial programming pulse has been applied, the target cell is read. The threshold voltage should be increased sufficiently so that the output of sense amplifier SA0 is active. However, the remaining sense amplifiers, including SA2, will remain inactive, therefore, the programming sequence is not completed. Another programming pulse is applied and the cell is read a second time. This sequence will continue until the cell has been programmed to the proper level, that is, until the Comparator 42 determines that the output of SA2 has become active. At this point, Comparator 42 will cause Program Control 36 to refrain from applying additional programming pulses.

Thus, a novel memory system has been disclosed which utilizes single transistor multistate memory cells, that is, cells capable of having a multiplicity (three or more) states. Although one embodiment has been described in some detail, it is to be understood that certain changes can be made without departing from the spirit and scope of the invention as defined by the appended claims. For example, although the cells 11 have been described as flash memory cells, other types of floating gate memory cells could also be used.

In addition, the exemplary memory system disclosed herein utilizes four states per cell. It would be possible to use a greater number of states per cell. In addition, certain specific threshold voltages have been assigned to a particular cell state as set forth in Table 2. It would be possible to assign different threshold voltages to different states, including increasing the number of states so that some states have enhancement threshold voltages and some states have depletion threshold voltages.

Figure 7A:
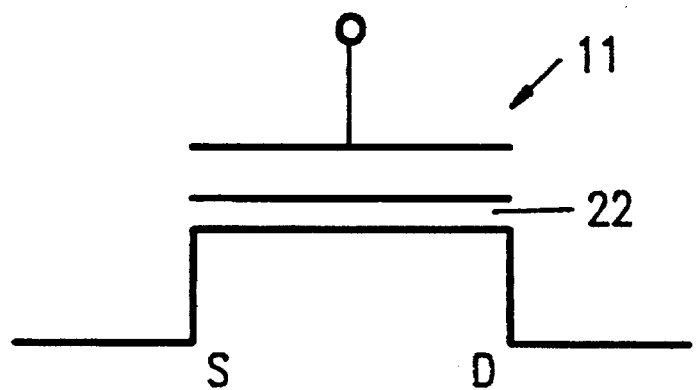
FIGS. 7A–7C are schematic representations of exemplary single transistor flash memory cells which can be used in the subject multistate memory system.

Also, the type of flash memory cell used in the array can be changed. FIGS. 3A/3B shows a cell 11 having a uniformly thin (typically 100 Å) gate oxide 22 which is represented schematically in FIG. 7A. The conditions for programming, erasing and reading are depicted in Table 1. For example, the cell structure described in a publication entitled "A 1.28 µm² Contactless Memory Cell Technology For a 3 Volt Only 64 Mb EEPROM", H. Kume et al. IEDM, 1992, pp 991–93 can also be adopted for use in this memory allowing multiple cell states.

Figure 7B:
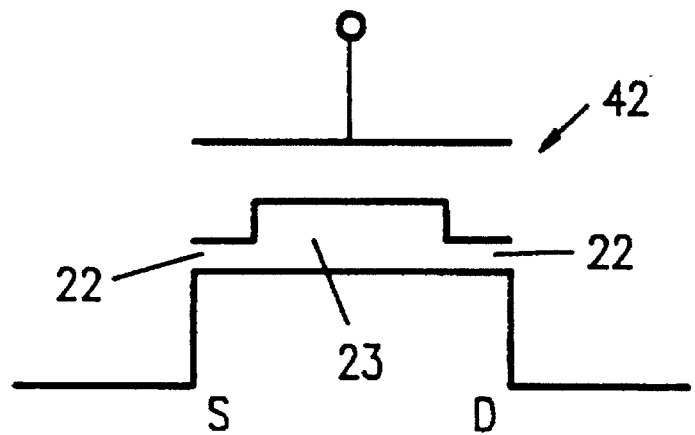

FIG. 7B shows another type of conventional flash memory cell 42 which can be used in connection with the subject invention. This cell is described in U.S. Pat. No. 5,103,273 to Gill et al. Cell 42 has a thin (typically 100 Å) gate oxide region 22 adjacent the drain region and adjacent the source region. Intermediate the thin gate oxide regions 22 is a thicker oxide 23 (typically 200 Å). Cell 42 is programmed primarily on the drain side of the cell and is erased only on the source side.

Figure 7C:
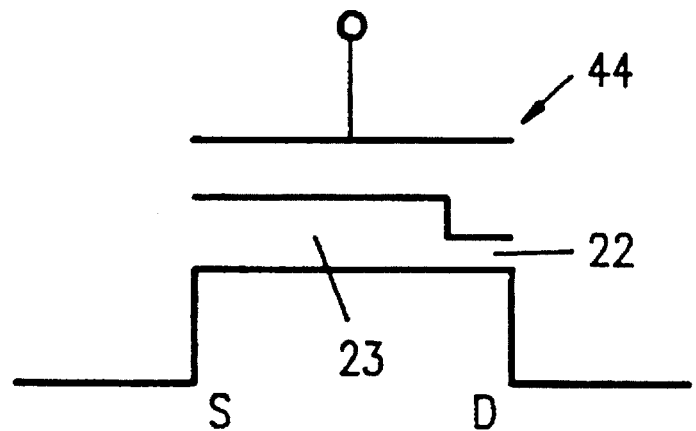

FIG. 7C shows a still further conventional alternative flash memory cell 44 which has a thin (typically 100 Å) gate oxide region 22 located near the source region and a thicker oxide 23 (typically 200 Å) above the remainder of the channel region. This cell is described in U.S. Pat. No. 5,051,795 to Gill et al. Cell 44 is programmed and erased on the drain side of the cell only.

Further, although the single transistor cell 11 and the related control circuits have been described as being implemented such that programming is carried out utilizing the Fowler-Nordheim tunneling mechanism, the implementation could be carried out so that programming utilizes the CHE mechanism as described in connection with FIG. 1A. In addition, memory array 28 is shown as a "Two Rail" configuration where the source and drain for each cell in a column have separate bit lines. This array configuration is typically used where cell of the type depicted in FIG. 3A are used where the programming mechanism is Fowler-Nordheim tunneling. In the event programming is carried out using the CHE mechanism, a "Single Rail" configuration is used where there is a single bit line connected to the drain regions of the cells located in a particular column. The source regions of all of the cells of the array are then connected to a common source line, as is well known.

What is claimed is:
1. A non-volatile memory system comprising:
 a memory cell array including
  a P conductivity type semiconductor body;
  a group of memory cells disposed in the semiconductor body and arranged in an array having a multiplicity of rows and columns, each of said cells including
   (a) a drain region of N conductivity type;
   (b) a source region of N conductivity type, spaced apart from the drain region, so as to form a channel region in the semiconductor body intermediate the source and drain regions;
   (c) a floating gate disposed over the channel region and insulated from the channel region;
   (d) a control gate disposed over the floating gate and insulated from the floating gate;
  with the control gates of all of the cells in one of the array rows being connected to a common word line; and
 control means for programming, reading and erasing the cells of the array, said control means including
  program means for applying a source voltage, a drain voltage, and a control gate voltage to a selected one of the cells of the array so to program the selected cell to a multiplicity of programmed states, with a first one of said programmed states resulting in the selected cell having a positive threshold voltage, relative to the source voltage of the selected cell, and with a second one of the programmed states resulting in the selected cell having a negative threshold voltage, relative to the source voltage of the selected cell; and
  read means for applying voltages to a selected cell of the array so that the programmed state of the selected cell can be determined, including the application of a positive voltage, relative to the source voltage of the selected cell, to the word line associated with the row in which the selected cell is located and for applying a negative voltage to the remaining word lines of the array.

2. The memory system of claim 1 wherein the memory cells are single transistor cells wherein the floating gate extends over the channel region from the drain region to the source region.

3. The memory system of claim 1 wherein the multiplicity of programmed states is four programmed states and wherein the read means functions to discriminate between the four programmed states.

4. The memory system of claim 1 wherein each of the cells located in one of the array columns have a source region connected to a common source bit line and a drain region connected to a common drain bit line.

5. The memory system of claim 4 wherein the program means functions to program the selected cell by way of Fowler-Nordheim tunneling.

6. The memory system of claim 1 wherein the program means functions to program the selected cell by way of channel hot electron injection.

7. The memory system of claim 1 wherein the program means includes erase means for erasing the cell utilizing Fowler-Nordheim tunneling.

8. A non-volatile memory system comprising:
 a memory cell array including
  a P conductivity type semiconductor body;
  a group of memory cells disposed in the semiconductor body and arranged in an array having a multiplicity of rows and columns, each of said cells including (a) a drain region of N conductivity type;

(b) a source region of N conductivity type, spaced apart from the drain region, so as to form a channel region in the semiconductor body having a length which extends from the drain region to the source region;

(c) a floating gate disposed over the channel region and insulated from the channel region, the floating gate extending from the source region to the drain region so as to overly the entire length of the channel region;

(d) a control gate disposed over the floating gate and insulated from the floating gate;

with the control gates of all of the cells in one of the array rows being connected to a common word line; and control means for programming, reading and erasing the cells of the array, said control means including program means for applying a source voltage, a drain voltage, and a control gate voltage to a selected one of the cells of the array so to program the selected cell to a multiplicity of programmed states, with a first one of said programmed states resulting in the selected cell having a positive threshold voltage, relative to the source voltage of the selected cell, and with a second one of the programmed states resulting in the selected cell having a negative threshold voltage, relative to the source voltage of the selected cell; and read means for applying voltages to a selected cell of the array so that the programmed state of the selected cell can be determined and for applying voltages to a plurality of deselected cells of the array so that the deselected cells remain substantially non-conductive when the selected cell is read.

9. The memory system of claim 8 wherein the read means functions to apply a positive voltage, relative to the source region of the selected cell, to the word line associated with the row in which the selected cell is located when the selected cell is being read and a negative voltage to the remaining word lines of the array.

10. The memory system of claim 9 wherein the multiplicity of programmed states is four programmed states and wherein the read means functions to discriminate between the four programmed states.

11. The memory system of claim 9 wherein each of the cells located in one of the array columns have a source region connected to a common source bit line and a drain region connected to a common drain bit line.

12. The memory system of claim 11 wherein each of the cells of the array in adjacent columns have a source region connected to separate ones of the source lines.

13. A method of controlling the operation of a memory system having a group of memory cells disposed in a P conductivity type semiconductor body and which are arranged in an array having a multiplicity of rows and columns, each of said cells being capable of operation in a depletion mode and an enhancement mode of operation and each of the cells including (a) a drain region of N conductivity type;

(b) a source region of N conductivity type, spaced apart from the drain region, so as to form a channel region in the semiconductor body intermediate the source and drain regions;

(c) a floating gate disposed over the channel region and insulated from the channel region;

(d) a control gate disposed over the floating gate and insulated from the floating gate; with the control gates of all of the cells in one of the array rows being connected to a common word line; the method comprising the following steps:

programming a selected cell to a predetermined one of a multiplicity of programmed states, with one of the programmed states resulting in the selected cell being in the depletion mode of operation and a second of the programmed states resulting in the selected cell being in the enhancement mode of operation; and reading a selected cell by applying a positive voltage relative to the source region of the selected cell to the word line associated with the selected cell and by applying a negative voltage to the remaining word lines of the array.

14. The method of claim 13 wherein the cells are single transistor cells with the floating gate extending over the channel region from the drain region to the source region.

15. The method of claim 13 further including the step of erasing the cells of the array.

16. The method of claim 15 wherein the step of erasing causes cells to be erased to the depletion mode of operation.

17. A non-volatile memory system comprising:

a memory cell array including a P conductivity type semiconductor body;

a group of memory cells disposed in the semiconductor body and arranged in an array having a multiplicity of rows and columns, each of said cells including (a) a drain region of N conductivity type;

(b) a source region of N conductivity type, spaced apart from the drain region, so as to form a channel region in the semiconductor body intermediate the source and drain regions;

(c) a floating gate disposed over the channel region and insulated from the channel region;

(d) a control gate disposed over the floating gate and insulated from the floating gate;

with the control gates of all of the cells in one of the array rows being connected to a common word line; and a control circuit which programs, reads and erases the cells of the array, said control circuit including a program circuit which applies a source voltage, a drain voltage, and a control gate voltage to a selected one of the cells of the array so to program the selected cell to a multiplicity of programmed states, with a first one of said programmed states resulting in the selected cell having a positive threshold voltage, relative to the source voltage of the selected cell, and with a second one of the programmed states resulting in the selected cell having a negative threshold voltage, relative to the source voltage of the selected cell; and read means for applying voltages to a selected cell of the array so that the programmed state of the selected cell can be determined, including the application of positive voltage, relative to the source voltage of the selected cell, to the word line associated with the row in which the selected cell is located and for applying a negative voltage to the remaining word lines of the array.

* * * * *